US012615710B2

(12) United States Patent
Ogawa et al.

(10) Patent No.: US 12,615,710 B2
(45) Date of Patent: Apr. 28, 2026

(54) WIRING BOARD, MANUFACTURING METHOD, ELECTRONIC MODULE, ELECTRONIC UNIT, AND ELECTRONIC DEVICE

(71) Applicant: CANON KABUSHIKI KAISHA, Tokyo (JP)

(72) Inventors: Yu Ogawa, Tokyo (JP); Toshiyuki Yoshida, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 239 days.

(21) Appl. No.: 18/480,343

(22) Filed: Oct. 3, 2023

(65) Prior Publication Data

US 2024/0121885 A1      Apr. 11, 2024

(30) Foreign Application Priority Data

Oct. 6, 2022      (JP) ................................. 2022-161857

(51) Int. Cl.
*H05K 1/02*          (2006.01)
*H05K 3/46*          (2006.01)

(52) U.S. Cl.
CPC ......... H05K 1/0224 (2013.01); H05K 1/0219 (2013.01); H05K 3/4691 (2013.01); *H05K 2201/0715* (2013.01); *H05K 2201/10151* (2013.01)

(58) Field of Classification Search
CPC ............... H05K 1/0224; H05K 1/0219; H05K 2201/0715; H05K 3/4691
See application file for complete search history.

(56) References Cited

U.S. PATENT DOCUMENTS

2012/0228009 A1      9/2012  Muro
2022/0400547 A1 *  12/2022  Aoki ................... H05K 1/0219

FOREIGN PATENT DOCUMENTS

JP          2003017613 A        1/2003
JP          2007335455 A      12/2007
JP          2019197785 A      11/2019

* cited by examiner

*Primary Examiner* — Jeremy C Norris
(74) *Attorney, Agent, or Firm* — Canon U.S.A., Inc. IP Division

(57)                    ABSTRACT

A wiring board includes a wiring layer, a shield layer, and an insulating layer. The wiring layer includes at least one signal line and at least one ground line. The shield layer overlaps the wiring layer in plan view. The insulating layer is provided between the wiring layer and the shield layer. The insulating layer includes at least one end portion surrounded by the insulating layer. The at least one end portion is located on at least the at least one ground line. A connection conductor line electrically connecting the shield layer to the at least one ground line is provided on part of the at least one end portion.

20 Claims, 12 Drawing Sheets

FIG. 2A
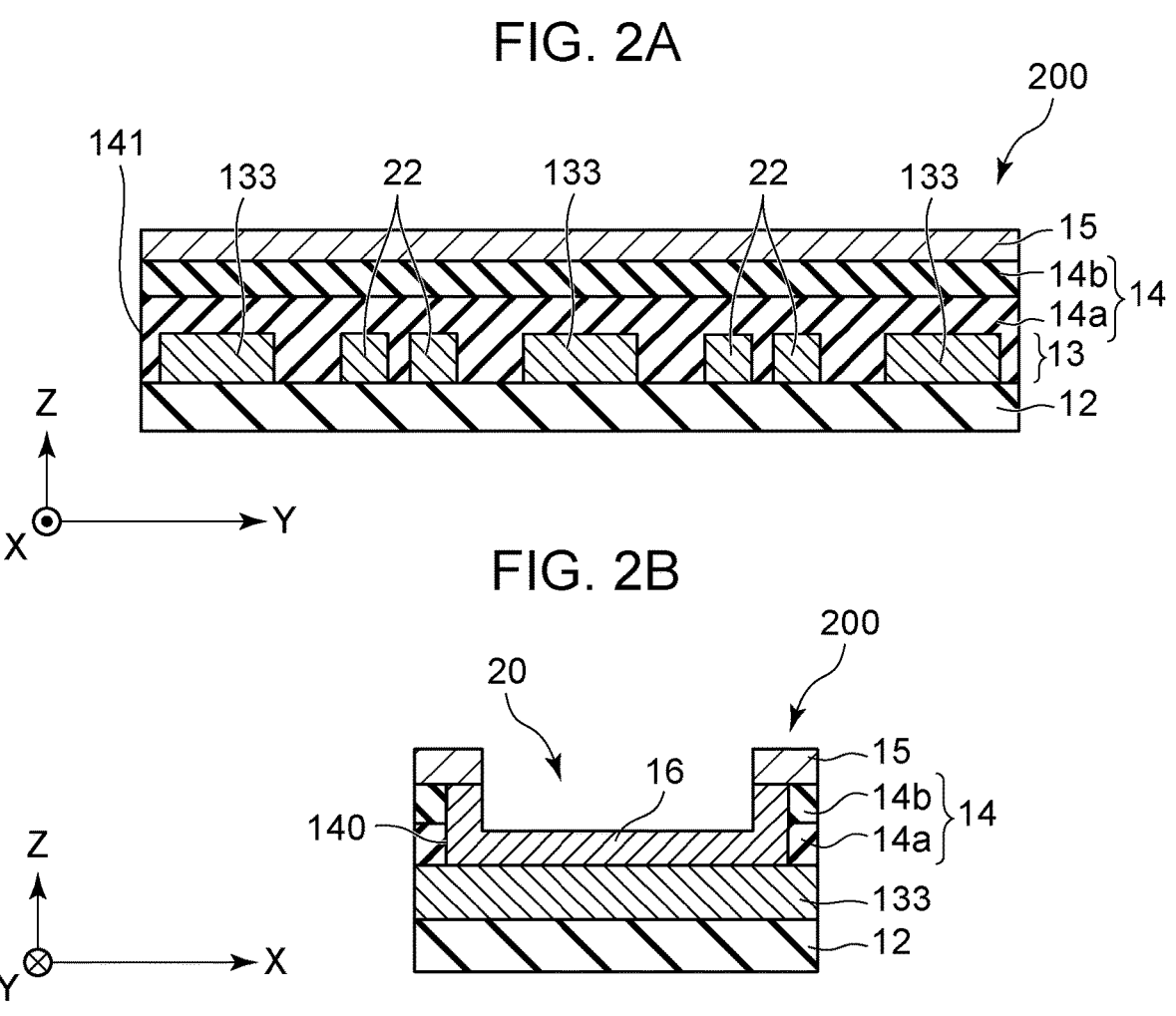
FIG. 2B
FIG. 2C
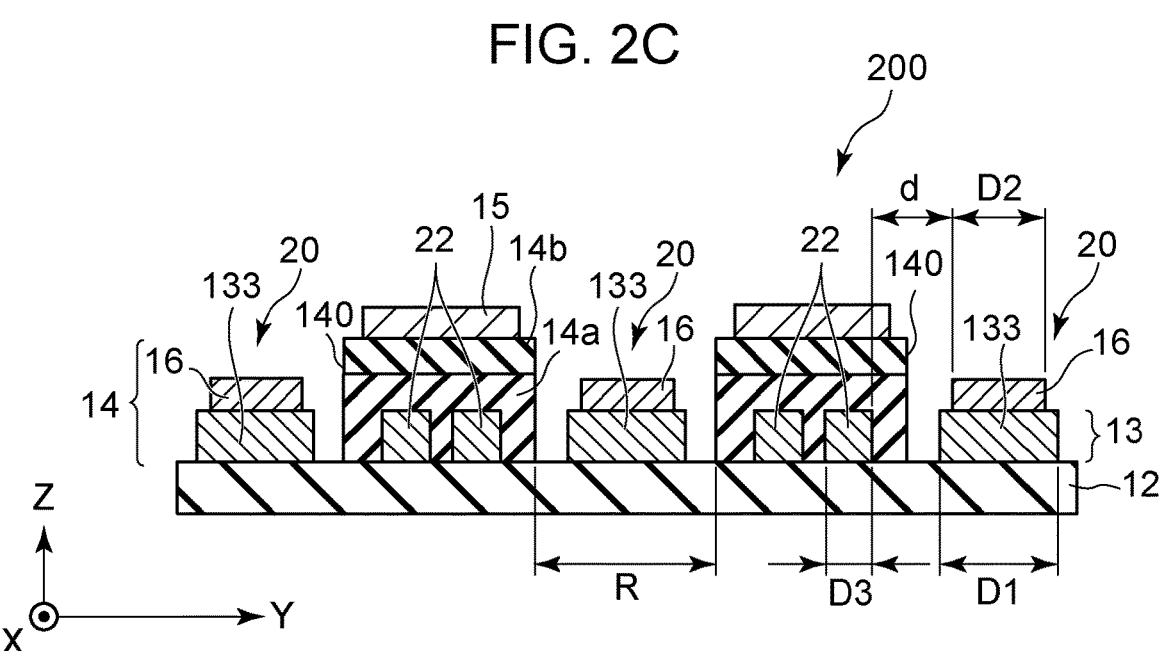

FIG. 7

WIRING BOARD, MANUFACTURING METHOD, ELECTRONIC MODULE, ELECTRONIC UNIT, AND ELECTRONIC DEVICE

BACKGROUND

Field

The present disclosure relates to a wiring board, a manufacturing method, an electronic module, an electronic unit, and an electronic device.

Description of the Related Art

Electronic devices, such as cell phones, smartphones, and digital cameras, are increasingly required to be compact, and the number of wires on a wiring board built into electronic devices is increasing due to high-density packaging. In addition, the transmission speed of signals flowing in wires has been increasing along with an increase in the volume of communicated information, resulting in an increase in unwanted radiation noise generated from the wiring board.

Japanese Patent Laid-Open No. 2007-335455 describes a flexible printed board in which a shield layer is provided on one side of signal lines via an insulating layer, a ground layer is provided on the other side via an insulating layer, and the shield layer is electrically connected to the ground layer via a through-hole provided in the insulating layer.

However, according to the configuration described in Japanese Patent Laid-Open No. 2007-335455, to obtain higher density wiring, a limitation is imposed in terms of the processing size and positional accuracy of the through-hole. For this reason, a configuration that enables higher density packaging has been required.

SUMMARY

The present disclosure provides a technique to reduce radiation noise in a wiring board and, thus, enable high-density wiring layout.

According to an aspect of the present disclosure, a wiring board includes a wiring layer including at least one signal line and at least one ground line, a shield layer that overlaps the wiring layer in plan view, and an insulating layer provided between the wiring layer and the shield layer, wherein the insulating layer includes at least one end portion surrounded by the insulating layer, wherein the at least one end portion is located on at least the at least one ground line, and wherein a connection conductor line configured to electrically connect the shield layer to the at least one ground line is provided on part of the at least one end portion.

Further features of the present disclosure will become apparent from the following description of exemplary embodiments with reference to the attached drawings.

BRIEF DESCRIPTION OF THE DRAWINGS

FIG. 2A is a cross-sectional view taken along line IIA-IIA of FIG. 1; FIG. 2B is a cross-sectional view taken along line IIB-IIB of FIG. 1; and FIG. 2C is a cross-sectional view taken along line IIC-IIC of FIG. 1.

FIG. 7 is a schematic illustration of a system used to evaluate the radiation noise characteristics of wiring boards according to examples and wiring boards according to comparative examples.

DESCRIPTION OF THE EMBODIMENTS

Figure 1:
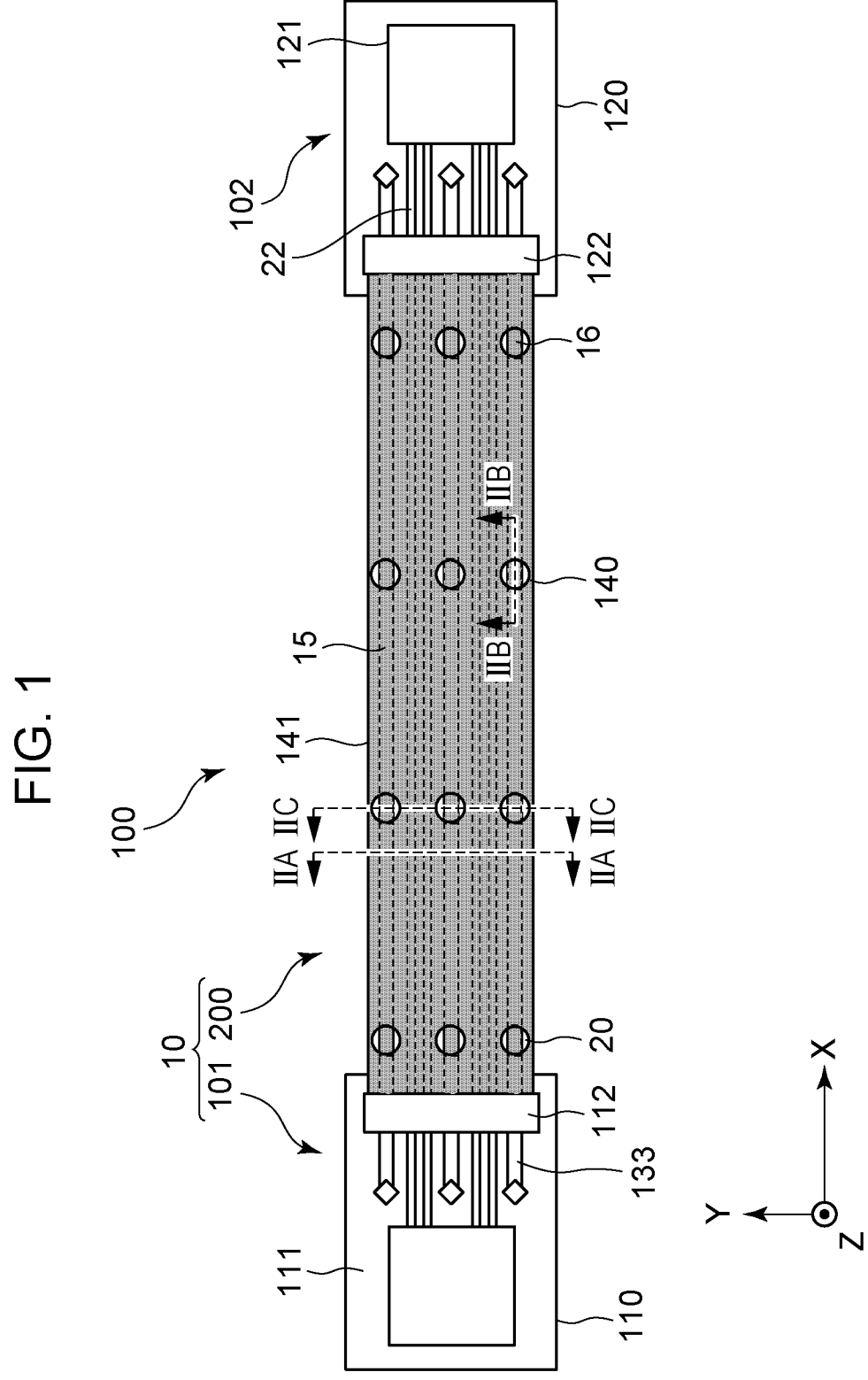
FIG. 1 is a top view of an electronic unit including a wiring board.

Embodiments of the present disclosure are described below with reference to the accompanying drawings. The embodiments described below are some of the embodiments of the present disclosure, and the present disclosure is not limited thereto. The common configurations are described by mutually referencing a plurality of drawings, and description of the configuration with the same reference numeral is omitted as appropriate. Different items with the same name can be differentiated by adding an ordinal prefix to the name, such as a first configuration, a second configuration, and so on.

First Embodiment

A first embodiment is described below with reference to FIG. 1 and FIGS. 2A to 2C. FIG. 1 is a top view of an electronic unit 100 including a wiring board 200. The wiring board 200 is, for example, a flexible printed board. A method for forming the conductor lines in the wiring board 200 is not limited to printing, but the conductor line may be pre-formed wires. The wiring board 200 may be a flat cable.

The electronic unit 100 includes a circuit board 101, a circuit board 102, and the wiring board 200 that electrically connects the circuit board 101 to the circuit board 102. The circuit board 101 and the circuit board 102 are, for example, printed circuit boards. A product in which the wiring board 200 and at least one of the circuit board 101 and the circuit board 102 are connected to each other can be referred to as an electronic module 10. For example, the electronic module 10 having the wiring board 200 connected to the circuit board 101 is prepared, and the wiring board 200 in the electronic module 10 is further connected to the circuit board 102. Thus, the electronic unit 100 can be formed. In addition, an electronic device including the electronic unit 100 can be configured.

As illustrated in FIG. 1, the wiring board 200 extends in the X direction, which is the longitudinal direction. The wiring board 200 includes a plurality of signal lines 22 and a plurality of ground lines 133. The signal lines 22 and the ground lines 133 each extend in the X direction. The plurality of signal lines 22 and the plurality of ground lines 133 are arranged so as to be spaced apart in the Y direction, which is the transverse direction intersecting the X direction. The Z direction, which is perpendicular to the X and Y directions, is the thickness direction of the wiring board 200. The wiring board 200 is flexible and bendably deformable.

According to the present embodiment, the entirety of plurality of signal lines 22 and the plurality of ground lines 133 are all arranged in the Y direction when viewed in the Z direction (in plan view). However, at least parts of the signal lines 22 and the ground lines 133 can be arranged parallel to one another in the Y direction in plan view.

A connector 112 is mounted on a wiring board 110 that constitutes the circuit board 101. The connector 112 is electrically connected to a semiconductor device 111 by a conductor pattern on the wiring board 110. Like the wiring board 110, a connector 122 is mounted on a wiring board 120 that constitutes the circuit board 102. The connector 122 is electrically connected to a semiconductor device 121 by a conductor pattern on the wiring board 120.

The wiring board 110 and the wiring board 120 are, for example, rigid wiring boards, which can be printed wiring boards containing resin or ceramic substrates (rigid printed boards).

Due to the above-described configuration, the semiconductor device 111 and the semiconductor device 121 are electrically connected to each other via the wiring board 110, the wiring board 200, and the wiring board 120 to enable communication with each other. At this time, the wiring board 200 may be directly connected to the wiring boards 110 and 120 with solder, without using the connectors 112 and 122.

The wiring board 200 according to the present embodiment is described below with reference to FIGS. 2A to 2C. FIG. 2A is a cross-sectional view taken along line IIA-IIA of FIG. 1, FIG. 2B is a cross-sectional view taken along line IIB-IIB of FIG. 1, and FIG. 2C is a cross-sectional view taken along line IIC-IIC of FIG. 1. The wiring board 200 includes an insulating layer (an insulating substrate) 12, insulating portions 14a and 14b, a wiring layer 13, and a shield layer 15. The wiring layer 13 includes the plurality of signal lines 22 and the plurality of ground lines 133 described above. The insulating layer 12 and the insulating portions 14a and 14b are made of an electrically insulating material. Each of the signal lines 22 and each of the ground lines 133 are made of a conductive substance. The insulating layer 12, the insulating portions 14a and 14b, the signal lines 22, the ground lines 133, and the shield layer 15 are formed so as to extend in the X direction. The signal lines 22 and the ground lines 133 that constitute the wiring layer 13 are arranged so as to be spaced apart in the Y direction inside of the insulating portion 14a but need not necessarily be located inside of the insulating portion 14a.

FIG. 2C illustrates two sets of paired signal lines among the plurality of signal lines 22. However, more than two sets may be provided. The number of signal lines disposed between the ground lines 133 is not limited to two but can be one or three or greater. The insulating layer 12 and insulating portions 14a and 14b are each formed in sheet form. According to the present embodiment, the insulating portion 14a is disposed between the insulating layer 12 and the insulating portion 14b. The insulating portion 14a has a bonding function to bond the insulating layer 12 and the insulating portion 14b. If the insulating portion 14b has a bonding function, the insulating portion 14a may be removed.

Each of the signal lines 22 is described in detail below. A conductor line having a bandwidth capable of transmitting digital data signals to be used is employed as each of the signal lines 22. To support more signal transmission quantity, it is desirable to form differential signal wiring in which two of the plurality of signal lines 22 form a pair, as in the present embodiment. The plurality of signal lines 22 may include a conductor line that transmits a single-ended signal, such as a control signal and a response signal.

The method for forming the signal lines 22 is not limited to a particular method. For example, the signal lines 22 can be formed by metal foil bonding, metal plating, an inkjet process, and the like. When copper foil is used as the metallic foil, a film bonded with an adhesive agent or the like can be used to form a required transmission line pattern by a photolithographic etching process. When an inkjet process is used, the signal lines 22 can be formed by printing a required pattern using polymer ink containing metal particles and firing the pattern at a temperature lower than or equal to the glass transition point (Tg) of the insulating layer 12. The thickness of the signal line 22 is not limited to a particular value. For example, it is desirable that the thickness be greater than or equal to 0.1 μm and less than or equal to 20 μm.

The wiring layer 13 including the signal lines 22 and the ground lines 133 is provided on the insulating layer 12 and is coated by the insulating portions 14a and 14b. The shield layer 15 is provided on the insulating portion 14b to prevent electromagnetic interference (EMI) caused by radiation noise generated by the occurrence of electromagnetic radiation from the signal lines 22.

The wiring layer 13 may include another conductor line or a conductive pattern in addition to the signal lines 22 and ground lines 133.

The shield layer 15 is a sheet-like member and is required to be disposed at least at a position facing or overlapping the signal lines 22 in plan view. As used herein, the term "position overlapping the signal lines 22 in plan view" refers to a position at which the shield layer 15 is stacked over the signal lines 22 in the thickness direction of the wiring board 200. The wiring layer 13 is provided inside of the insulating portion 14a. The insulating portion 14a is a protective layer that coats the wiring layer 13 so that the wiring layer 13 is not brought into contact with surrounding members of the wiring board 200. The insulating portion 14a is a member having electrical insulation properties.

As illustrated in FIG. 2B, the wiring board 200 includes an end portion 140 surrounded by the insulating portions 14a and 14b. A connection conductor line 16 provided on the end portion 140 enables electrical connection between the ground line 133 and the shield layer 15. The end portion 140 according to the present embodiment is provided on each of all the ground lines 133. However, the end portion 140 can be provided on at least one of the ground lines 133. It is desirable that the connection conductor line 16 be formed in a line shape extending in the X direction and not be provided in a portion other than the portion where the connection conductor line 16 overlaps the ground line 133 in plan view.

As illustrated in FIG. 2C, an opening region 20 and the insulating portions 14a and 14b are alternately arranged. The ground line 133 and the connection conductor line 16 are provided in the opening region 20, and the connection conductor line 16 is provided on only part of the end portion 140. That is, in the opening region 20, the connection conductor line 16 is not provided in a portion other than the part of the end portion 140. For example, as illustrated in FIG. 2B, the connection conductor line 16 is provided on the end portion 140 in the opening region 20 in the X direction and as illustrated in FIG. 2C, the connection conductor line 16 is not provided on the end portion 140 in the opening region 20 in the Y direction. The term "part of the end portion 140" implies that the connection conductor line 16 is not provided on the entirety of the end portion 140, and a plurality of connection conductor lines 16 extending between parts of the end portion 140 (traversing the end portion 140) may be provided. A reason the configuration can reduce the size of the wiring board 200 is described below.

As described above, according to the wiring board 200 of the present embodiment, the connection conductor line 16 is provided across parts of the end portion 140. If, unlike the wiring board 200 of the present embodiment, the connection conductor line 16 is provided on the entirety of the end portion 140, the connection conductor line 16 is located near the signal line 22 in the opening region 20. When the distance between the connection conductor line 16 and the signal line 22 is small, the quality of the signal flowing through the signal line 22 may deteriorate. In addition, if the design is such that the signal line 22 is provided near the opening region 20, the opening region 20 may hang over the signal line 22 depending on the processing accuracy of the opening region 20. In this case, if the connection conductor line 16 is provided over the entire opening region 20, the signal lines 22 may short-circuit. Therefore, when the connection conductor line 16 is provided over the entire opening region 20, the signal line 22 needs to be located away from the opening region 20. If the design is such that the opening region 20 and the signal line 22 are located at a distance from each other, the width of the wiring board increases, which makes it difficult to reduce the size of the wiring board.

For this reason, the wiring board 200 according to the present embodiment is configured so that the connection conductor line 16 is not provided on part of the end portion 140 in the Y direction. This allows the signal line 22 to be disposed near the opening region 20, and the size of the wiring board 200 can be reduced. Furthermore, according to the present embodiment, the opening region 20 can be disposed so as to overlap the signal lines 22 in plan view, which can further reduce the size of the wiring board 200. While the connection conductor line 16 extends in the X direction, the connection conductor line 16 does not necessarily have to extend in the X direction. It is only required that the connection conductor line 16 electrically connect the shield layer 15 to the ground line 133 and be provided in part of the opening region 20 in the Y direction. Among the end portions 140, the end portion having no connection conductor line 16 can achieve the above-described effect more than the end portion having the connection conductor line 16 if the end portion is provided adjacent to the signal line 22. While the present embodiment has been described with reference to the end portion 140 having the connection conductor line 16 on part thereof in the Y direction, the direction is not limited to the Y direction. By providing the connection conductor line 16 in only part of the opening region 20, the area of the connection conductor line 16 can be reduced as compared with the case where the connection conductor line 16 is provided in the entire opening region 20. Thus, the manufacturing cost of the wiring board 200 can be reduced. According to the present embodiment, the opening region 20 surrounded by the end portion 140 includes a plurality of opening portions formed to be arranged in the Y direction, and the contour of each region is closed.

In the top view of the wiring board 200 according to each of the embodiments, the boundary between an insulating layer 14 and the opening region 20 is not clearly illustrated, but the insulating layer 14 is basically provided in the region other than the opening region 20.

To reduce the size of the wiring board 200, it is desirable that a distance d between the signal line 22 and the connection conductor line 16 illustrated in FIG. 2C be less than a width D1 of the ground line 133. To ensure the signal quality, it is desirable that the distance d be greater than or equal to the width D3 of the signal line 22. It is desirable that the distance between the signal line 22 and the ground line 133 be greater than or equal to 50 μm and less than 100 μm, and it is desirable that the width D1 of the ground line 133 be greater than or equal to 100 μm and less than or equal to 200 μm.

It is desirable that a width D2 of the connection conductor line 16 be less than the width D1 of the ground line 133. By designing the width D2 to have a small value, interference of the connection conductor line 16 with the signal line 22 can be reduced. It is desirable that the width D2 of the connection conductor line 16 be greater than or equal to 30 μm. If the width D2 is less than 30 μm, the strength decreases, and the connection conductor line 16 may break.

The wiring board 200 according to the present embodiment includes the shield layer 15 on the surface of the wiring board 200 and is configured such that the end portion 140 of the insulating layer 14 in the opening region 20 has a portion where the connection conductor line 16 is provided and a portion where the connection conductor line 16 is not provided. This configuration can achieve both the radiation noise reduction effect and reduction in size of the wiring board 200.

For example, to process the opening region 20, the insulating portions 14a and 14b are removed in advance before stacking by punching or laser processing and is bonded. Alternatively, when the insulating portions 14a and 14b is stacked, resin is applied in a predetermined pattern by screen printing or a dispenser to form the opening region 20. When the opening region 20 is formed by punching or laser processing, a diameter R of the opening region 20 is greater than the width D1 of the ground line 133 because there is a limit to reduce the opening region 20. When the connection conductor line 16 is provided over the entire opening region 20 in the case of the diameter R greater than the width D1, the connection conductor line 16 may interfere with the signal line 22.

In FIG. 1, the shape of the opening region 20 is circular in plan view. However, the shape is not limited to a particular shape. The opening region 20 can be formed to have a shape selected from various shapes as needed, for example, an elliptical shape, square shape, polygonal shape, star-like shape, trapezoidal shape, and a slit-like shape extending in the Y direction. However, from the viewpoint of the manufacturing cost and film toughness, a circular shape or an elliptical shape is desirable. From the viewpoint of the processing accuracy, it is desirable that the size of the opening region 20 in the Y direction be greater than or equal to 200 μm.

The method for manufacturing the shield layer 15 is not limited to a particular method. However, direct patterning by various printing techniques, such as screen printing and inkjet printing is desirable. Alternatively, a conductive film may be patterned by a photolithographic etching process. A shield layer 15 that has been pre-processed into a predetermined shape by die cutting or braiding may be directly bonded.

Examples of a method for forming the shield layer 15 on the insulating portion 14b include a subtractive method, electroless plating, electrolytic plating, and a physical vapor deposition method, such as vacuum evaporation or sputtering. Alternatively, a conductive fiber bonding method or a screen printing method can be employed. Examples of a metal that forms the shield layer 15 include copper, aluminum, nickel, iron, gold, silver, platinum, tungsten, chromium, titanium, tin, lead, palladium, and any combination of at least two of the above-described metals. From the viewpoint of the conductive properties and low cost, silver or copper is desirable.

It is desirable that the thickness of the shield layer 15 be greater than or equal to 1 μm, and it is more desirable that the thickness be greater than or equal to 5 μm. If the thickness is less than 1 μm, sufficient bending resistance cannot be obtained. If the thickness of the shield layer 15 is less than or equal to 20 μm, the thickness of the wiring board 200 can be also reduced, thus providing a more flexible wiring board 200. It is desirable that the surface resistance of the shield layer 15 be less than or equal to 1Ω/□, and it is more desirable that the surface resistance be less than or equal to 0.1Ω/□.

The connection conductor line 16 serves to electrically connect the shield layer 15 to the ground line 133. By the electrical connection, the shield layer 15 can fully achieve the radiation noise reduction effect.

The method for forming the connection conductor line 16 is not limited to a particular method. Examples of a method for forming the connection conductor line 16 include a screen printing method in which a mask is placed, and conductive paste is transferred from the mask using a squeegee by a printing technique and a method in which the conductor line is drawn on the end portion of the insulating layer using a dispenser or inkjet. Examples of a metal that form the connection conductor line 16 include copper, aluminum, nickel, iron, gold, silver, platinum, tungsten, chromium, titanium, tin, lead, and palladium, and any combination of at least two of the above-described metals. From the viewpoint of the conductive properties and low cost, silver or copper is desirable.

The insulating layer 12 and the insulating portions 14a and 14b are described in detail below.

The insulating layer (the insulating substrate) 12 is first described in detail. It is desirable that the material of the insulating layer 12, which is the insulating substrate, be resin. Examples of a resin include polyimide resins, such as polyimide, polyamide, and polyamideimide, thermosetting resins, such as epoxy, and thermoplastic resins, such as liquid crystal polymers. Among these resins, polyimide or liquid crystalline polymers are desirable. Polyimide has excellent heat resistance and mechanical properties is easily commercially available. Liquid crystalline polymers have a low relative permittivity, making them suitable for high-speed signal transmission applications. In addition, liquid crystalline polymers have low moisture absorbency and excellent dimensional stability.

The thickness of the insulating layer 12 is not limited to a particular value. However, it is desirable that the thickness is greater than or equal to 10 μm and less than or equal to 100 μm. If the thickness is less than 10 μm, the distance between the signal line 22 and the shield layer 15 is small, and the characteristic impedance value may be excessively increased. In contrast, if the thickness is greater than 100 μm, the stiffness of the resin may increase, and flexibility may be insufficient. It is more desirable that the thickness is greater than or equal to 12 μm and less than or equal to 75 μm. The material of the insulating layer 12 is a fiber base material when the wiring board 200 is a rigid substrate. Example of a fiber base material include glass fiber base materials (woven and nonwoven) and an inorganic fiber base material (woven and nonwoven) with a component of an inorganic compound other than glass. Examples of a fiber base material further include organic fiber base materials composed of organic fibers, such as aromatic polyamide, polyamide, aromatic polyester, polyester, polyimide, and fluororesin. Among others, a glass fiber base material is desirable in terms of superior strength and low water absorption.

The insulating portion 14a is described in detail below. The insulating portion 14a is an adhesive layer provided between the insulating layer (the insulating substrate) 12 and the insulating portion 14b and between the signal lines 22. That is, the insulating portion 14a is a cured adhesive agent. It is desirable that the insulating portion 14a have high electrical insulation properties. Examples of an adhesive agent used to form the insulating portion 14a include acrylonitrile butadiene rubber (NBR) adhesive agents, polyamide adhesive agents, polyester adhesive agent, acrylic adhesive agent, polyester polyurethane adhesive agent, and silicone adhesive agent.

It is desirable that the insulating portion 14a sufficiently coat the signal line 22, which is a transmission line, and be flat and smooth. Therefore, it is desirable that the thickness of the insulating portion 14a in the z-direction is greater than or equal to 2 μm and less than or equal to 50 μm. If the thickness of the insulating portion 14a is greater than 2 μm, the adhesive agent is sufficiently embedded between the signal lines 22, and the signal lines 22 can be more firmly bonded to the insulating portion 14a. If the thickness of the insulating portion 14a is less than or equal to 50 μm, it is possible to prevent the adhesive agent from seeping out from between the insulating layer 12 and the insulating portion 14b to the side. Furthermore, from the above-described viewpoints, it is more desirable that the thickness of the insulating portion 14a in the Z direction be greater than or equal to 5 μm and less than or equal to 30 μm.

A method for forming the insulating portion 14a is not limited to a particular method. For example, the insulating portion 14a is formed by bonding sheet-like adhesive agent to the insulating layer 12 and the signal line 22 and curing the adhesive agent or by applying a liquid adhesive agent using a dispenser or a printing method and, thereafter, curing the adhesive agent by heat or ultraviolet light.

The insulating portion 14b is described in detail below. Plastic and/or insulating resin can be used for the insulating portion 14b. An example of plastic used for the insulating portion 14b is a so-called engineering plastic. That is, other plastics used for the insulating portion 14b include, for example, polypropylene, cross-linked polyethylene, polyester, polybenzoimidazole, polyamide, polyimide, polyimideamide, and polyetherimide. Furthermore, plastics used for the insulating portion 14b include, for example, polyphenylene sulfide (PPS), polyethylene naphthalate (PEN), and polyetheretherketone (PEEK). From the viewpoint of low cost, it is desirable that a polyester film be employed. From the viewpoint of superior flame resistance, it is desirable that a polyphenylene sulfide film be employed. When higher heat resistance is required, it is desirable that an aramid film or a polyimide film be employed.

The insulating resin used for the insulating portion 14b can be any resin having electrical insulating properties, such as thermosetting resin or UV-curable resin. Examples of a thermosetting resin include phenol resin, acrylic resin, epoxy resin, melamine resin, silicone resin, and acrylic modified silicone resin. Examples of UV-curable resin include epoxy acrylate resins, polyester acrylate resins, and their methacrylate modified products. The curing mode may be heat curing, ultraviolet curing, electron beam curing, or the like. Another additive agent, such as color pigments, flame retardant, antioxidant, lubricant, anti-dusting agent, and curing accelerator, may be blended as needed.

The method for forming the insulating portion 14*b* is not limited to a particular method. For example, the following methods can be used to coat the insulating portion 14*a* with the insulating portion 14*b*. For example, the insulating portion 14*a* can be coated with a solution obtained by dissolving an insulating resin in a solvent by gravure coating, kiss coating, die coating, blade coating, roll coating, knife coating, spray coating, bar coating, spin coating, or dip coating. The Solvent can be selected in accordance with the type of resin used.

For example, ketone solvent, such as acetone, methyl ethyl ketone, or cyclohexanone, or alcohol solvent such as methanol, ethanol, propanol, ethylene glycol, glycerin, or propylene glycol monomethyl ether can be used. Alternatively, acid, such as acetic acid, amide solvent, such as formamide, dimethylacetamide, or N-methylpyrrolidone, nitrile solvent, such as acetonitrile or propironitrile, or ester solvent, such as methyl acetate or ethyl acetate, can be used. Still alternatively, carbonate solvent, such as dimethyl carbonate or diethyl carbonate, can be used. During coating, a heating or drying process may be performed to vaporize the solvent as needed. For heating and drying, heating and drying devices, such as a hot-air dryer or an infrared heater, can be used, and the heating temperature, drying temperature, heating time, and drying time can be selected as needed.

It is desirable that the thickness of the insulating portion 14*b* in the Z direction be greater than or equal to 5 μm and less than or equal to 50 If the thickness of the insulating portion 14*b* in the Z direction is greater than or equal to 5 μm, sufficient strength can be attained for the insulating portion 14*b*. If the thickness of the insulating portion 14*b* in the Z direction is less than or equal to 50 μm, sliding and bending properties are improved. Furthermore, from the above-described viewpoints, it is more desirable that the thickness of the insulating portion 14*b* in the Z direction be greater than or equal to 10 μm and less than or equal to 30 μm. It is desirable that the volume resistivity of the insulating portion 14*b* be greater than or equal to 109 ohm-centimeter (Ω·cm) and is more desirable that the volume resistivity be greater than or equal to 1013 Ω·cm.

Second Embodiment

Figure 3:
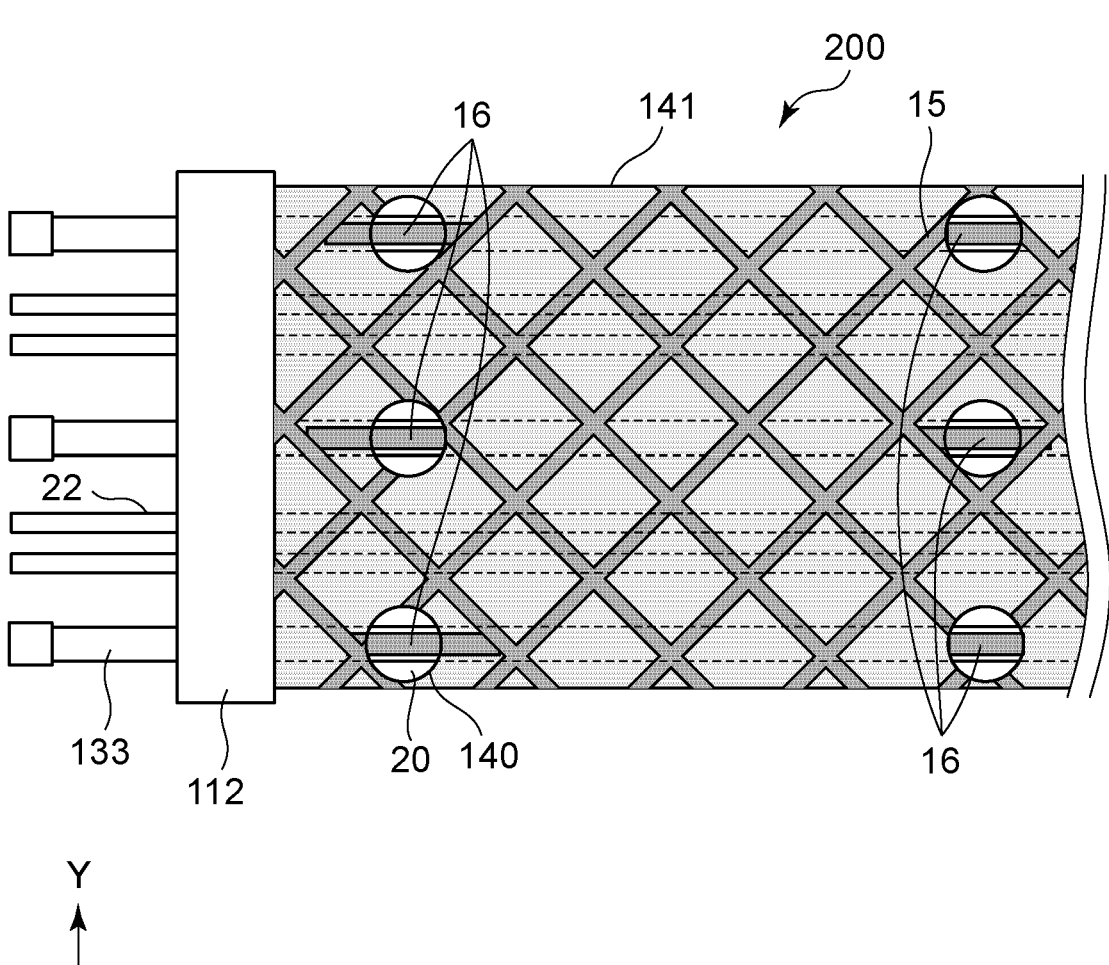
FIG. 3 is a top view of a wiring board according to a second embodiment.
Figure 3:
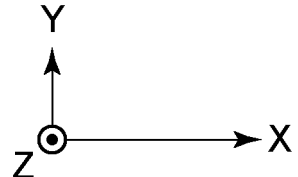

A wiring board 200 according to the second embodiment is described below with reference to FIG. 3. FIG. 3 is an enlarged view of the main part of the wiring board 200 according to the present embodiment. Unlike the first embodiment, the wiring board 200 according to the present embodiment includes a shield layer 15 having a mesh-like structure.

According to the present embodiment, an insulating layer 14 has an opening region 20, and a connection conductor line is provided so as to traverse only part of the end portion 140. A connection conductor line 16 electrically connects the shield layer 15 to the ground line 133 to reduce radiation noise.

The shield layer 15 having a mesh-like structure can achieve a wiring board 200 that is more flexible than the wiring board 200 of the first embodiment. For example, if the wiring board 200 is a flexible printed board that requires flexibility, it is desirable that the wiring board 200 have higher flexibility so that the bending resistance is small when the wiring board 200 bends. As a result, a wiring board 200 can be achieved that satisfies the three requirements, that is, radiation noise reduction effect, a small size, and improved flexibility of the wiring board 200.

In FIG. 3, the connection conductor line 16 having a portion provided outside of the opening region 20 is illustrated. The connection conductor line 16 provided outside of the opening region 20 can function as the shield layer 15.

When the shield layer 15 has a mesh-like shape, the connection conductor line 16 in the opening region 20 alone may not provide electrical connection. For this reason, the connection conductor line 16 is provided to provide electrical connection between the shield layer 15 and the connection conductor line 16 in the opening region 20.

Third Embodiment

Figure 4:
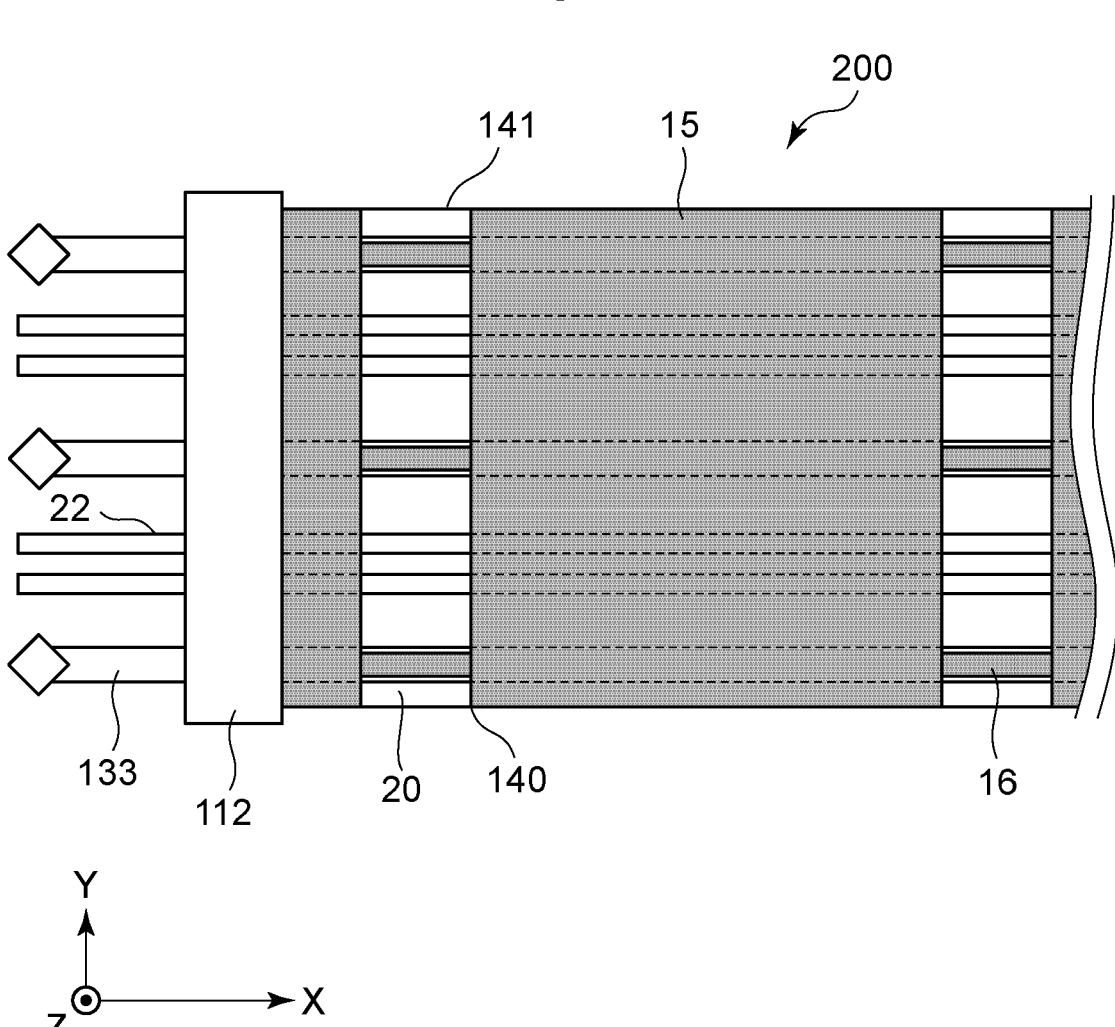
FIG. 4 is a top view of a wiring board according to a third embodiment.
Figure 4:
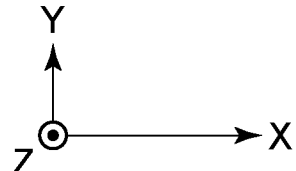

A wiring board 200 according to the third embodiment is described with reference to FIG. 4. FIG. 4 is an enlarged view of the main part of the wiring board 200 according to the present embodiment. Unlike the first embodiment, according to the wiring board 200 of the present embodiment, the opening region 20 has a slit-like shape that traverses the wiring board 200 in the Y direction. Although the end portion of the slit does not constitute a closed contour in plan view, the shape is herein also referred to as an "opening region 20".

Even when the opening region 20 is formed as a slit that traverses the wiring board 200, the connection conductor line 16 is provided on the ground line 133 to provide electrical connection between the shield layer 15 and the ground line 133. According to the present embodiment, the opening region 20 is formed not only over the ground line 133 but also over the signal line 22. However, even in this configuration, since the connection conductor line 16 is provided to traverse only part of the end portion 140 in the Y direction, the signal line 22 does not short-circuit to the shield layer 15. Even in this case, it is desirable that the distance d between the connection conductor line 16 and the signal line 22 be greater than or equal to the width D3 of the signal line 22 and less than or equal to the width D1 of the ground line 133.

Fourth Embodiment

Figure 5:
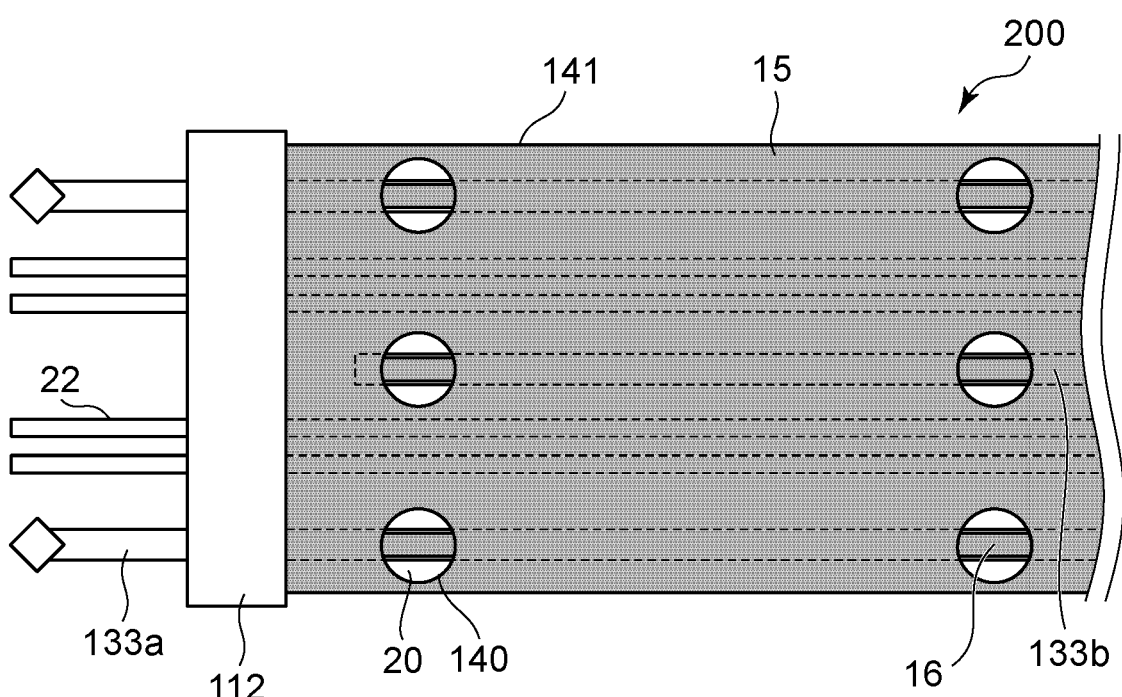
FIG. 5 is a top view of a wiring board according to a fourth embodiment.
Figure 5:
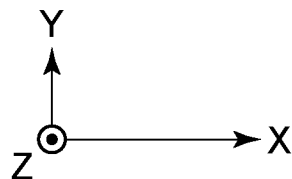

A wiring board 200 according to the fourth embodiment is described below with reference to FIG. 5. FIG. 5 is an enlarged view of the main part of the wiring board 200 according to the present embodiment. Unlike the first embodiment, the wiring board 200 according to the present embodiment includes, between the signal lines 22, a ground line 133*b* that is not connected to the connector 112.

The ground line 133*b* is electrically connected to the ground line 133*a* via the shield layer 15 that is connected to the ground line 133*a* connected to connector 112. By providing the ground line 133*b* not connected to the connector 112, the need for a connector pin for connecting to the connector 112 is eliminated, and the width of the wiring board 200 in the vicinity of the connector 112 can be reduced.

The ground line 133*a* does not necessarily have to be located in all of a plurality of gaps between two pairs of signal lines 22, and one of the ground lines 133 between at least three pairs of signal lines 22 may be the ground line 133*b*.

Fifth Embodiment

Figure 6A:
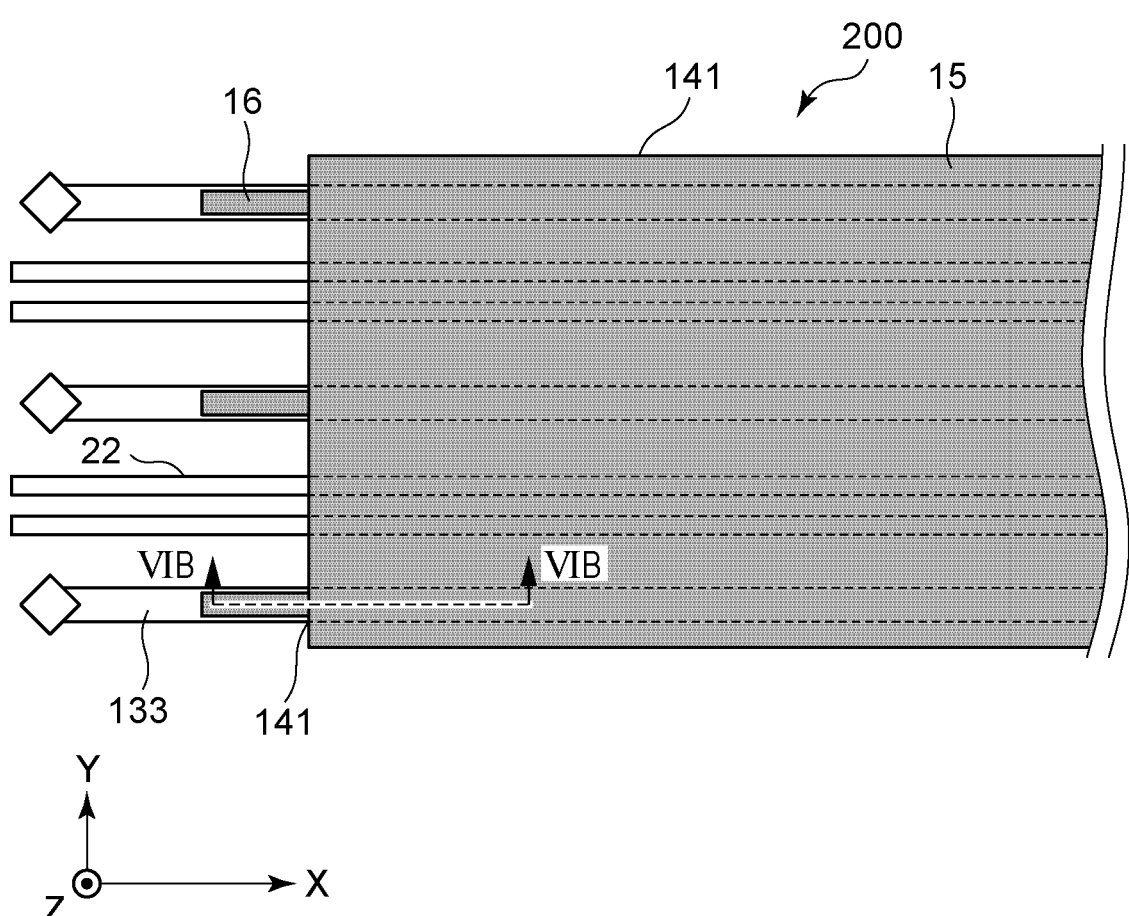
FIG. 6A is a top view of the wiring board according to a fifth embodiment.
Figure 6B:
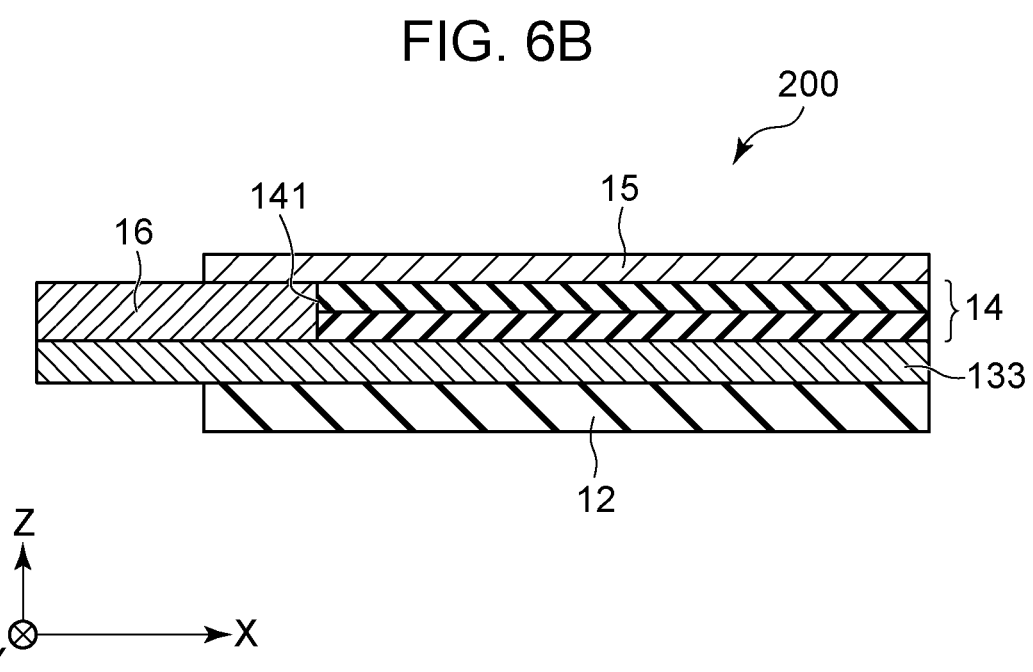
FIG. 6B is a cross-sectional view of the wiring board according to the fifth embodiment.

A wiring board 200 according to the fifth embodiment is described below with reference to FIGS. 6A and 6B. FIG. 6A is a top view of the wiring board 200 according to the present embodiment, and FIG. 6B is a cross-sectional view taken along line VIB-VIB of FIG. 6A. Unlike the first embodiment, the wiring board 200 according to the present embodiment does not include the connector 112 and the end portion 140, and the shield layer 15 is electrically connected to the ground line 133 on the end portion 141.

According to the present embodiment, the end portion 141 of the insulating layer 14 is not an end portion formed when an opening region 20 is provided, but an end portion that is formed when the insulating layer 14 is partially provided on the ground line 133. That is, the end portion 141 is an end portion that is not surrounded by the insulating layer 14 and that surrounds the insulating layer 141. Like the above-described embodiments, according to the present embodiment, the connection conductor line 16 is provided so as to traverse, in the Y direction, only part of the end portion 141 formed when the insulating layer 14 is formed. Since the opening region 20 is not formed, the manufacturing cost of the wiring board 200 can be reduced. In addition, since the connector 112 is not provided, the installation cost of the connector is also unnecessary.

However, to enhance the shielding function of the shield layer 15, in addition to the configuration according to the present embodiment, the opening region 20 and the end portion 140 described in the other embodiments may be provided, and the shield layer 15 may be electrically connected to the ground line 133 in the opening region 20. Even in this case, as described in the first embodiment, the connection conductor line 16 can be provided so as to traverse only a part of the end portion 140 in the Y direction in the opening region 20. Thus, interference with the signal line 22 can be reduced, and the size of the wiring board 200 can be reduced.

EXAMPLES

The present disclosure is described in more detail below with reference to examples and comparative examples. However, the present disclosure is not limited to the following examples. An evaluation technique (a measurement technique) of wiring boards according to the present disclosure is described below.

Figure 7:
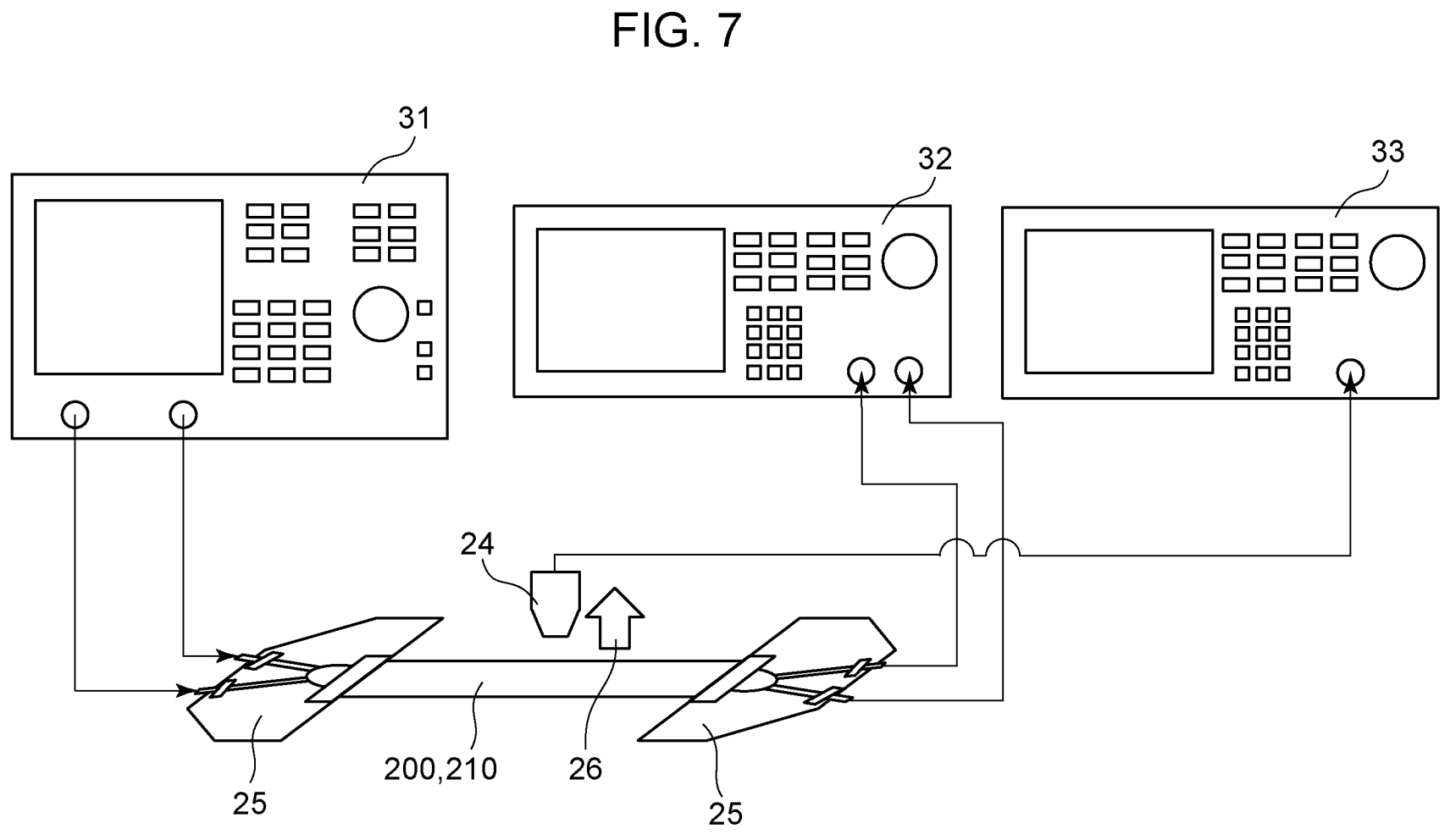

The evaluation technique for the wiring boards of the examples and comparative examples is described below. Radiation Noise Measurement The amounts of radiation noise of the wiring board 200 according to the example and a wiring board 210 according to the comparison example (refer to FIGS. 9 to 11) were evaluated using a system having the configuration illustrated in FIG. 7. As a reference, a wiring board without a shield layer 15 was prepared to measure the amount of radiation noise of the wiring board. As a wiring layer, a 12 μm thick copper foil was stacked on one side of a 25 μm thick polyimide film substrate (Kapton 100H available from Toray Dupont Co., Ltd.). Subsequently, a differential transmission line of 140 μm width, 55 μm spacing, and 120 mm length was produced by an etching technique. Subsequently, a 12.5 μm thick polyimide film and a 15 μm thick coverlay (CISV1215 available from NIKKAN INDUSTRIES Co., Ltd.) were bonded on top of the wiring layer to obtain a substrate with the differential signal wiring for reference without the shield layer 15. The wiring board was then connected to a connection board 25. A signal generator 31 (M8041A available from Keysight Technologies) was used to transmit a data pattern with a bit rate of 5.3 Gbps as a pseudorandom binary sequence (PRBS). The waveform of a common mode voltage was then observed using an oscilloscope 32 (92504A available from Agilent Technologies, Inc.), and the input amplitude was adjusted so that the common mode voltage was 150 mV.

Subsequently, wiring boards to be measured (those of the example and comparative example) were connected to the connection board 25, and a data pattern with a bit rate of 5.3 Gbps was transmitted as PRBS by using the signal generator 31. At this time, the input amplitude was set to a value adjusted using the wiring board for reference, which includes differential signal wiring and does not include the shield layer 15. The 1 GHz radiation noise 26 generated from the wiring board was detected using a pen-shaped near field probe 24 with a length of 110 mm (available from Electro-Metrics Corporation) and was measured using a spectrum analyzer 33 (E4440A available from Keysight Technologies). The near field probe 24 was placed at points 5 mm above the wiring board, and five scans were performed per point. Thereafter, the average 1 GHz noise amount when the near field probe 24 scanned at all points at 1 mm intervals for the entire region of the wiring board was defined as the radiation noise amount from the wiring board. The smaller the radiation noise amount, the more strongly the radiation noise is shielded, and a wiring board having a more excellent radiation noise reduction effect is obtained. Radiation noise measurements were conducted in the frequency range of 300 kHz to 20 GHz in an atmosphere with a temperature of 25° C. and a relative humidity of 23% to 50%.

Example 1

The wiring board 200 illustrated in FIGS. 2A to 2C was produced. A 25 μm thick polyimide film (Kapton 100H available from Toray Dupont Co., Ltd.) was prepared as the insulating layer (insulating substrate) 12. A 12 μm thick copper foil serving as the wiring layer 13 was stacked on top of the insulating layer 12, and 100 mm length signal lines 22 and ground lines 133 were formed by an etching technique. The signal lines 22 were formed as a differential signal wiring pair with a spacing of 55 μm between the signal lines 22 and a width of 205 μm for the pair of signal lines 22. In addition, the ground line 133 having a width of 100 μm was disposed on both sides of the pair of signal lines 22 at a distance of 150 μm from the adjacent signal line 22. Thus, the wiring layer 13 was obtained. From the viewpoint of insulation of the signal lines 22, the insulating layer 12 was used such that the ground lines 133 located in both end portions of the wiring board 200 were 500 μm from the edge of the wiring board 200.

Subsequently, the insulating layer 14 was formed on the wiring layer 13. A 25 μm thick adhesive agent was used as the insulating portion 14a, and a 15 μm thick coverlay (CEAM0525KA available from Arisawa Manufacturing Co., Ltd.) was used as the insulating portion 14b. Thus, the 37.5 μm thick insulating layer 14 was formed. The opening regions 20 were provided at 20 mm, 40 mm, 60 mm, and 80 mm from the connector 112 in the signal transmission direction over each of the ground lines 133. To form the opening regions 20, circular through-holes of 0.4 mm in diameter were formed in the insulating portions 14a and 14b by laser processing in advance before stacking. Thereafter, the insulating layer 14 was bonded to top of the wiring layer 13 with a positional accuracy of ±0.2 μm.

Subsequently, the shield layer 15 was formed on top of the insulating layer 14, and the connection conductor line 16 was formed in the opening region 20. The shield layer 15 and the connection conductor line 16 were formed into a thickness of 5 μm by printing silver paste (DD-1630L-245 available from KYOTO ELEX CO., LTD.) using a screen printer (MT-320T available from Micro-tec Co., Ltd.). At this time, the print position accuracy of the screen printing was ±30 μm. The shield layer 15 was printed in solids over the entire surface, as illustrated in FIG. 1, and the connection conductor line 16 was printed across the opening region 20 with a width of 80 μm at a position where the center position of the connection conductor line 16 coincided with the center position of the ground line 133 in the Y direction. Thus, the shield layer 15 and the connection conductor line 16 were formed simultaneously to obtain the wiring board 200 of Example 1.

Example 2

As illustrated in FIG. 3, the signal lines 22 each having a width of 75 μm were formed as a differential signal wiring pair with a spacing of 55 μm, and the ground line 133 having a width of 150 μm was formed at a distance of 75 μm from the signal line 22 adjacent to the ground lines 133. Furthermore, the shield layer 15 was printed into a square mesh shape pattern having a width of 50 μm and an opening width of 500 μm such that each side of the square was 45 degrees to the signal line 22. The other configurations were formed in the same manner as in Example 1. Thus, the wiring board 200 of Example 2 was obtained.

Example 3

The wiring board 200 of Example 3 was obtained in the same way as in Example 1, except that the shape of the opening region 20 was changed to a slit with a width of 0.3 mm that traversed the wiring board 200 in the Y direction as illustrated in FIG. 4.

Example 4

As illustrated in FIG. 5, the ground line 133*b* between two pairs of signal lines 22 was not wired up to the connector 112 but was terminated 5 mm away from the connector 112 in the X direction. The other configurations were formed in the same manner as in Example 1. Thus, the wiring board 200 of Example 4 was obtained.

Example 5

Figure 8:
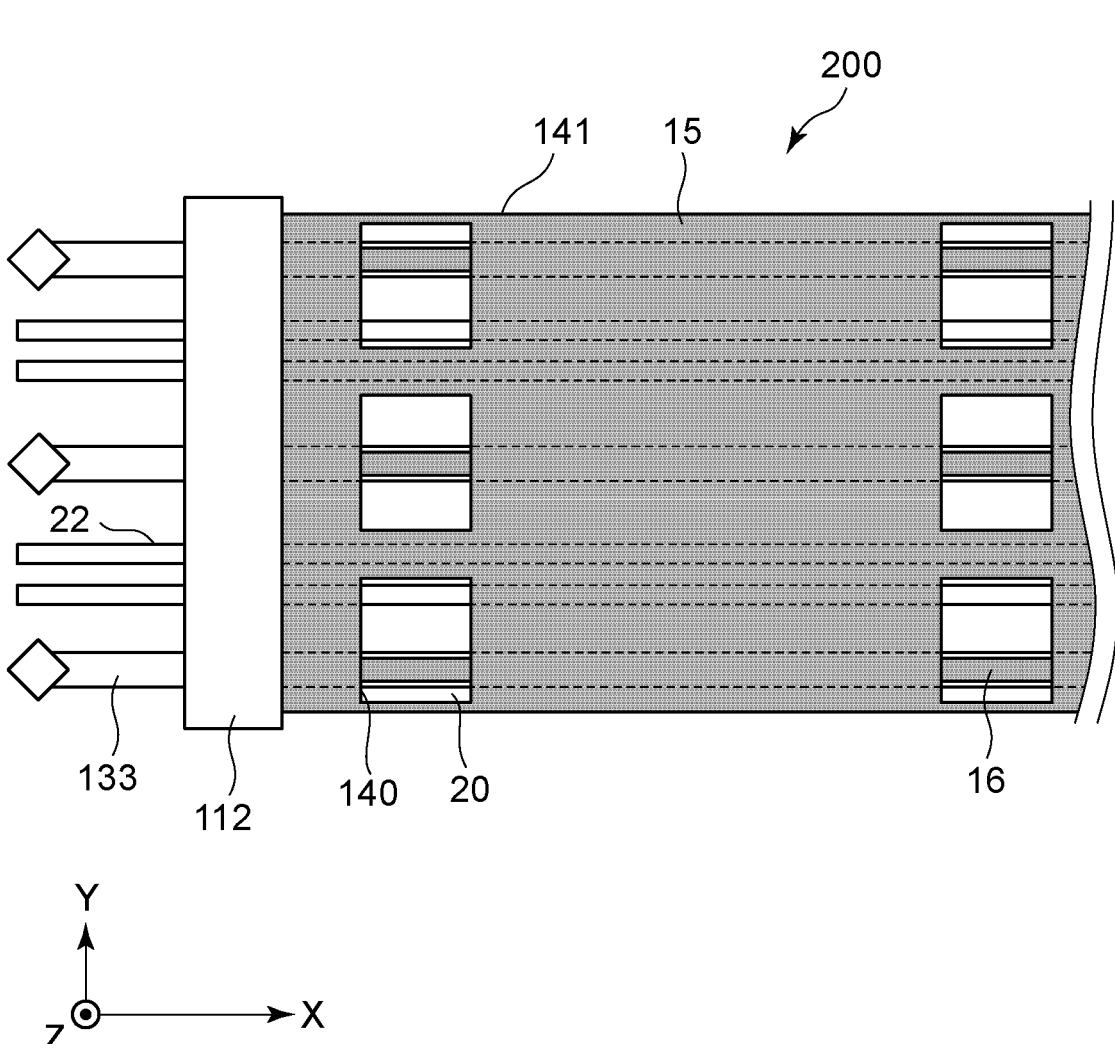
FIG. 8 is a top view of a wiring board according to Example 5.

In contrast to Example 1, the shape of the opening region 20 was changed to a square through-hole with a side of 0.5 mm as illustrated in FIG. 8. The other configurations were formed in the same manner as in Example 1. Thus, the wiring board 200 of Example 5 was formed.

Comparative Example 1

Figure 9:
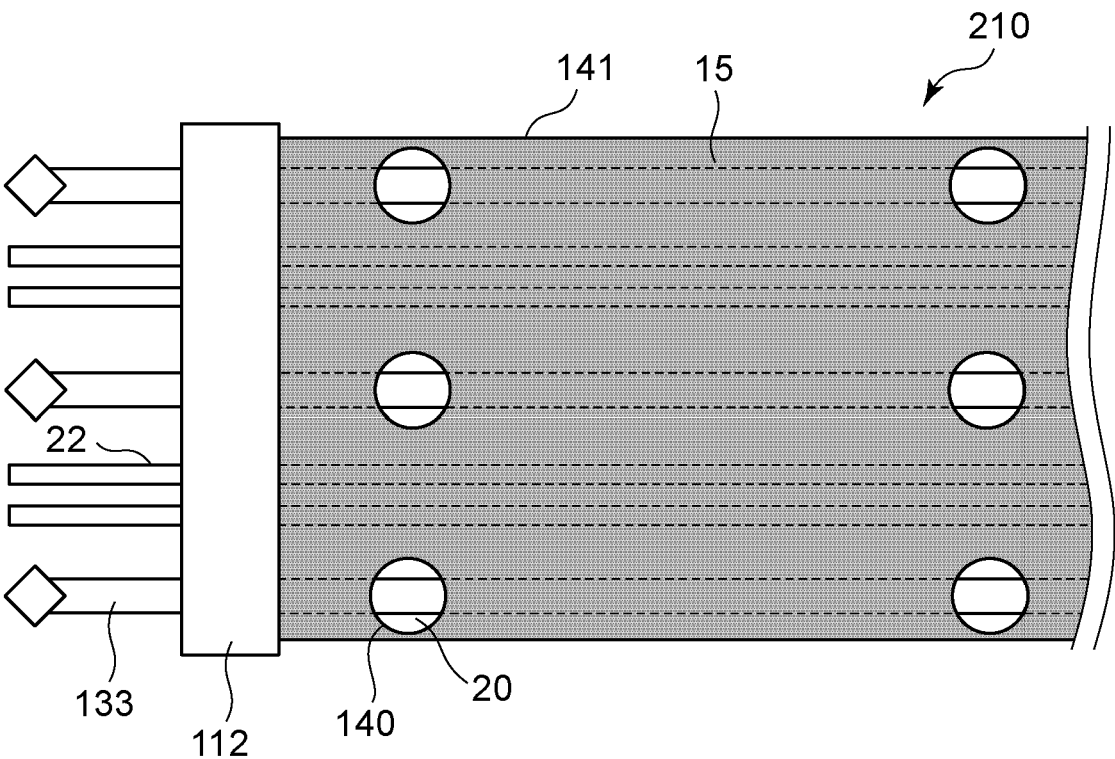
FIG. 9 is a top view of a wiring board according to Comparative Example 1.
Figure 9:
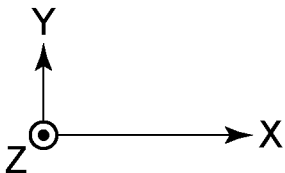

As illustrated in FIG. 9, the wiring board 210 of Comparative Example 1 was formed in the same manner as in Example 1, except that the connection conductor line 16 was not provided.

Comparative Example 2

Figure 10:
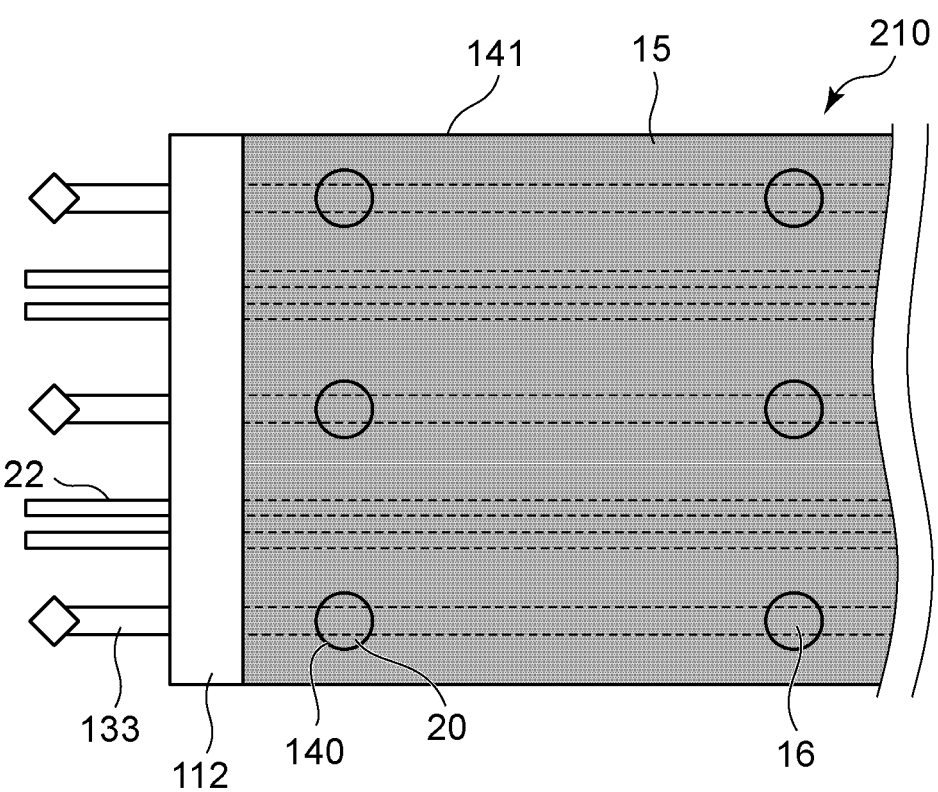
FIG. 10 is a top view of a wiring board according to Comparative Example 2.
Figure 10:
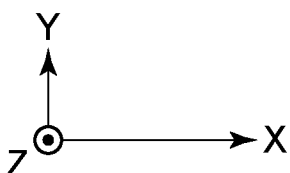

As illustrated in FIG. 10, after the shield layer 15 was formed, silver paste (DD-1630L-245 available from KYOTO ELEX CO., LTD.) that formed the connection conductor line 16 was applied using a dispenser to completely coat the opening region 20. At this time, to ensure the insulation of the signal line 22 even if the opening region 20 is misaligned, the distance between the ground line 133 and the signal line 22 was changed to 350 The other configurations were formed in the same manner as in Example 1. Thus, the wiring board 210 of Comparative Example 2 was obtained.

Comparison Example 3

Figure 11:
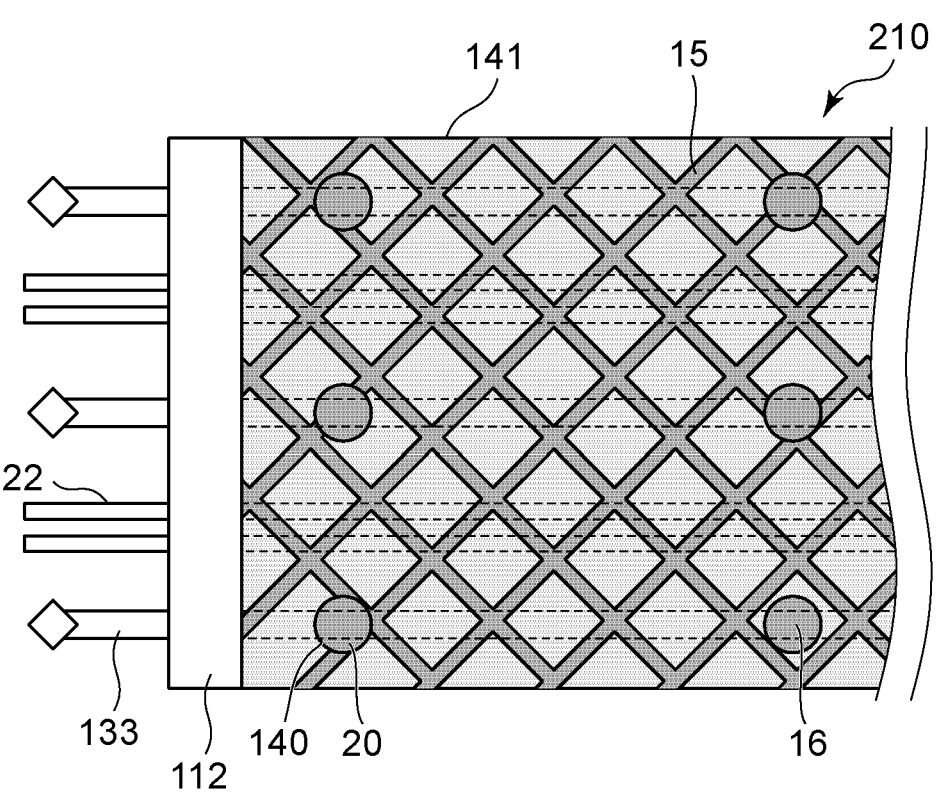
FIG. 11 is a top view of a wiring board according to Comparative Example 3.
Figure 11:
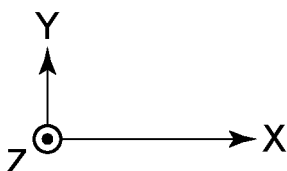

As illustrated in FIG. 11, after the shield layer 15 with a mesh-like structure was formed, silver paste (DD-1630L-245 available from KYOTO ELEX CO., LTD.) that formed the connection conductor line 16 was applied using a dispenser to completely coat the opening region 20. At this time, to ensure the insulation of the signal line 22 even if the opening region 20 is misaligned, the distance between the ground line 133 and the signal line 22 was changed to 275 μm as compared with Example 4. The other configurations were formed in the same manner as in Example 4. Thus, the wiring board 210 of Comparative Example 3 was obtained.

TABLE 1

|  | Example 1 | Example 2 | Example 3 | Example 4 | Example 5 | Comparative Example 1 | Comparative Example 2 | Comparative Example 3 |
|---|---|---|---|---|---|---|---|---|
| Wiring Board Width (mm) | 2.53 | 2.53 | 2.53 | 2.16 | 2.53 | 2.53 | 3.43 | 2.96 |
| Number of Connector Pins | 6 | 6 | 6 | 6 | 5 | 6 | 6 | 6 |
| Radiation Noise Amount (dBμV) | 18 | 18 | 18 | 21 | 22 | 29 | 17 | 18 |

As can be seen from Table 1, according to the wiring boards 200 of Examples 1 to 5, the amount of radiation noise at 1 GHz is low and excellent. Comparing Example 1 with Example 5, in Example 5, the ground line 133*b* is not connected to the connector 112 and is electrically connected to the ground line 133*a* via the shield layer 15. This reduces the number of connector pins by one, enabling the wiring board 200 to be made more compact at the end portion of the wiring board 200.

In Comparative Example 1, the connection conductor line 16 is not provided. As a result, the radiation noise reduction effect cannot be fully achieved, as compared with Example 1. In Comparative Examples 2 and 3, the connection conductor line 16 completely coats the opening region 20. In such a configuration, if the same wiring spacing as in Examples 1 and 4 is used, a short circuit occurs if the signal line 22 is even slightly exposed below the opening region 20. For this reason, it is necessary to increase the distance between the ground line 133 and the signal line 22 in consideration of the processing size and misalignment accuracy of the opening region 20 and, thus, the width of the wiring board 200 has increased as compared with in Examples 1 and 4.

In Examples 2 and 3, the opening region 20 hangs over not only the ground line 133 but also the signal line 22, and the signal line 22 is exposed. However, since the connection conductor line 16 makes only electrical connection between the ground line 133 and the shield layer 15, the signal line 22 is not short-circuited, and signal transmission is available. In addition, when, as in Examples 2 and 3, the opening region 20 traverses the plurality of signal lines 22, the distance between the ground line 133 and the signal line 22 can be reduced, allowing the size of the wiring board 200 to be reduced more.

Sixth Embodiment

Figure 12:
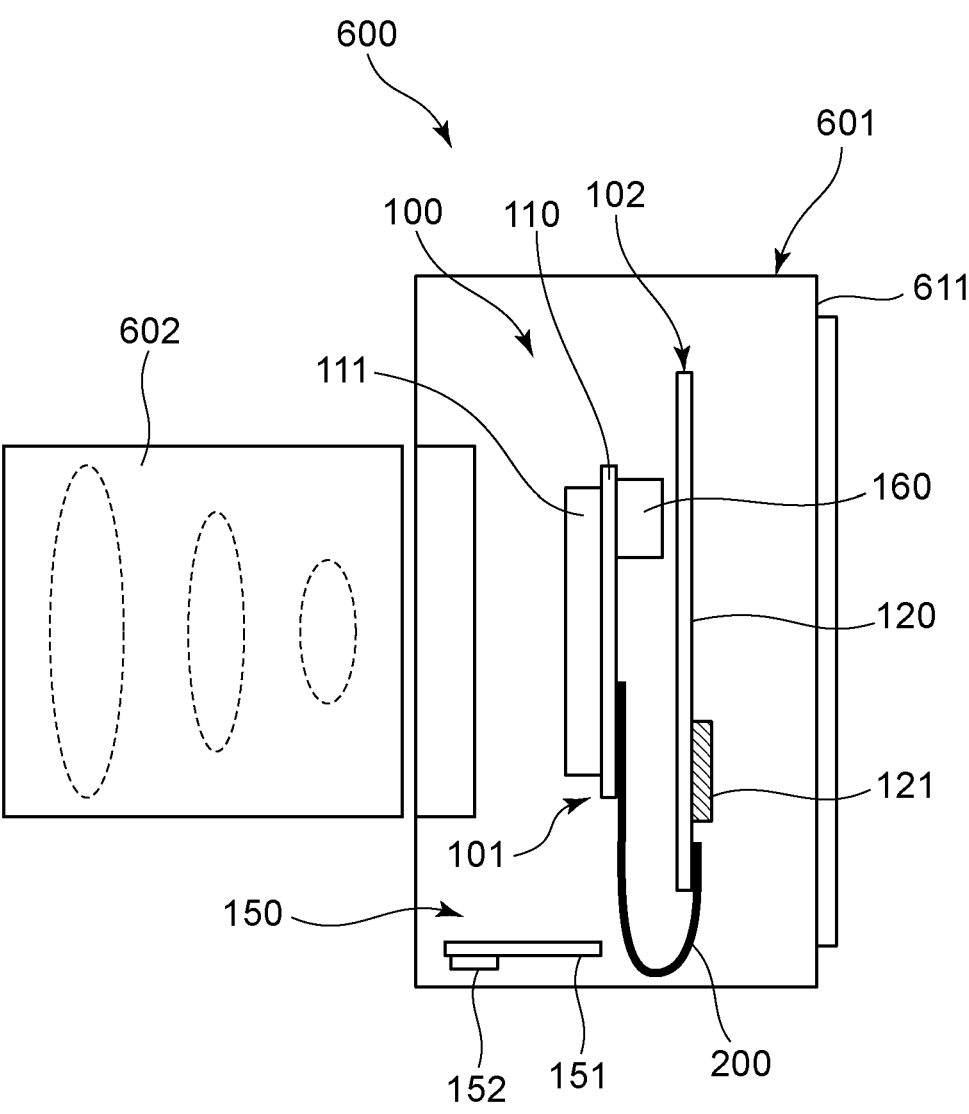
FIG. 12 is an illustration diagram of a digital camera, which is an image pickup apparatus as an example of an electronic device according to an embodiment.

As an example of an electronic device using any one of the wiring boards according to the first to fifth embodiment, a digital camera 600, which is an image pickup apparatus, is described blow with reference to FIG. 12.

The digital camera 600 is a lens-interchangeable digital camera. The digital camera 600 includes a camera body 601. The camera body 601 allows a lens unit (lens barrel) 602 including a lens to be removable. The camera body 601 includes an enclosure 611, an electronic unit 100, and a wireless communication unit 150. The electronic unit 100 and the wireless communication unit 150 are housed inside the enclosure 611. The electronic unit 100 is an imaging unit in the case of an image pickup apparatus.

The electronic unit 100 includes a circuit board 101, a circuit board 102, and a wiring board 200 that electrically connects the circuit board 101 to the circuit board 102. By using the wiring board 200 for the connection between the circuit board 101 and the circuit board 102, the wiring structure can be made lighter than a coaxial cable. According to the present embodiment, any one of the wiring boards previously described in the first to fifth embodiments is used as the wiring board 200.

The circuit board 101 includes the wiring board 110 and the semiconductor device 111 mounted on the wiring board 110. The circuit board 102 includes the wiring board 120 and the semiconductor device 121 mounted on the wiring board 120. The semiconductor device 111 and the semiconductor device 121 are examples of electronic components mounted on the wiring boards 110 and 120, respectively. The electronic components mounted on the wiring boards 110 and 120 can be an imaging device, an arithmetic device, a display device, a communication device, a storage device, and a power supply device. The electronic components mounted on the wiring boards 110 and 120 can be passive components as well as active components.

According to the present embodiment, the semiconductor device 111 is an image sensor (an imaging device). The image sensor is, for example, a CMOS (complementary metal oxide semiconductor) image sensor or a CCD (charge coupled device) image sensor. The image sensor has a function of converting light incident through the lens unit 602 into an electrical signal. According to the present embodiment, the semiconductor device 121 is a processor (an arithmetic device), such as a digital signal processor or an image signal processor. The image signal processor has the function of acquiring electrical signals representing image data from the semiconductor device 111, which is the image sensor (the imaging device), performing a process to correct the acquired electrical signals, and generating and outputting the corrected image data. A product in which the circuit board 101 connected to the wiring board 200 includes an image sensor can be referred to as an imaging module or an imaging unit. The imaging module is an example of an electronic module, and the imaging unit is an example of the electronic unit 100.

According to the present embodiment, the electronic unit 100 includes a drive device 160 that moves the circuit board 101 (the wiring board 110 and semiconductor device 111). The drive device 160 includes a motor that is an example of a drive source. In the digital camera 600 including the electronic unit 100 that includes the drive device 160, a camera shake correction (anti-vibration) function can be achieved by moving the semiconductor device 111 via the circuit board 101. The drive source of the drive device 160 is not limited to an electromagnetic motor but can be a piezoelectric motor, such as an ultrasonic motor, or an electrostatic motor. Since the wiring board 200 is connected to the circuit board 101 to be moved, flexibility is required for the wiring board 200.

Instead of the electronic unit 100 including the wiring board 200, the circuit board 101, and a circuit board 102, a product including one of the circuit board 101 and the circuit board 102 in addition to the drive device 160 and other components can be also referred to as an electronic unit.

According to the present embodiment, the wiring board 200 is bended and mounted in the digital camera 600 and is disposed so that the side adjacent to the shield layer 15 is the outer curved surface. That is, the shield layer 15 corresponds to the surface adjacent to the enclosure 611.

The wireless communication unit 150 performs GHz-band wireless communication and is modularized. The wireless communication unit 150 includes a rigid wiring board, which is an example of a wiring board 151 including an antenna (not illustrated), and a wireless communication IC 152 mounted on the wiring board 151. The antenna is provided in the same plane as the wireless communication IC 152 and is disposed close to the enclosure 611 for easy communication with the outside. It is desirable that the wireless communication IC 152 perform wireless communication with an external device, such as a PC or a wireless router, so as to be capable of transmitting and/or receiving image data via the antenna. According to the present embodiment, the wireless communication IC 152 is capable of transmitting and receiving data via the antenna. More specifically, the wireless communication IC 152 modulates digital signals representing image data acquired from the semiconductor device 121 and transmits the digital signal from the antenna in the form of radio waves of a standard radio communication frequency. In addition, the wireless communication IC 152 demodulates radio waves received by the antenna into a digital signal representing image data. The wireless communication IC 152 communicates wirelessly with external devices in accordance with the standards, such as Wi-Fi® or Bluetooth®. When the shield layer 15 provided in the wiring board 200 of the electronic unit 100 (the imaging unit) is used as an electromagnetic shield, it can be prevented that the electromagnetic waves emitted from the wireless communication unit 150 generates noise in the electronic unit 100. The wiring board 200 can also be used to connect the wiring board 151 to another wiring board.

The above-described embodiments can be modified as necessary without departing from the technical concept.

For example, the plurality of embodiments can be combined in any way. A subset of matters of at least one of the embodiments can be deleted or replaced.

A new matter may be added to at least one of the embodiments. The disclosure includes not only what is explicitly described herein, but also all matters ascertainable from the present specification and the drawings attached to the present specification.

The disclosure herein includes a complementary set of individual concepts described herein. That is, if the present specification contains the statement "A is greater than B", it is considered that the present specification also contains the statement "A is not greater than B". This is because it is apparent that the statement "A is greater than B" assumes that the case where "A is not greater than B".

A technique is provided that is advantageous in reducing radiation noise in a wiring board and that enables high-density wiring layout.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-161857 filed Oct. 6, 2022, which is hereby incorporated by reference herein in its entirety.

What is claimed is:

1. A wiring board comprising:
a wiring layer including at least one signal line and at least one ground line;
a shield layer that overlaps the wiring layer in plan view; and
an insulating layer provided between the wiring layer and the shield layer,
wherein the insulating layer includes at least one end portion surrounded by the insulating layer,
wherein the at least one end portion is located on at least the at least one ground line, and
wherein a connection conductor line configured to electrically connect the shield layer to the at least one ground line is provided on part of the at least one end portion.

2. The wiring board according to claim 1, wherein the insulating layer includes a certain end portion that surrounds the insulating layer, and the connection conductor line configured to electrically connect the shield layer to the at least one ground line is provided on part of the certain end portion.

3. The wiring board according to claim 1, wherein a second part of the at least one end portion on which the connection conductor line is not provided is disposed closer to the at least one signal line than the first part of the at least one end portion on which the connection conductor line is provided.

4. The wiring board according to claim 1, wherein the at least one end portion is provided so as to overlap at least part of the at least one signal line in plan view.

5. The wiring board according to claim 1, wherein the at least one end portion includes a plurality of end portions, and the at least one signal line and the at least one ground line are arranged parallel to each other in a predetermined direction, and
wherein regions surrounded by the plurality of end portions form a plurality of opening portions arranged in the predetermined direction.

6. The wiring board according to claim 1, wherein the at least one signal line and the at least one ground line are arranged parallel to each other in a predetermined direction, and the at least one signal line and the at least one ground line extend in a direction that intersects the predetermined direction, and
wherein the connection conductor line is formed in a line that extends in the direction that intersects the predetermined direction.

7. The wiring board according to claim 1, wherein the at least one signal line and the at least one ground line are arranged parallel to each other in a predetermined direction, and
wherein a width of the connection conductor line is less than a width of the at least one ground line in the predetermined direction.

8. The wiring board according to claim 1, wherein the at least one signal line and the at least one ground line are arranged parallel to each other in a predetermined direction, and
wherein a distance between the connection conductor line and the at least one signal line is less than a width of the at least one ground line in the predetermined direction.

9. The wiring board according to claim 1, wherein the at least one signal line and the at least one ground line are arranged parallel to each other in a predetermined direction, and a region surrounded by the at least one end portion is formed in a circular shape in plan view, and
wherein a diameter of the region surrounded by the at least one end portion is greater than a width of the at least one ground line in the predetermined direction.

10. The wiring board according to claim 1, wherein the shield layer has a mesh-like structure.

11. The wiring board according to claim 10, wherein part of the connection conductor line is in the same layer as the shield layer.

12. The wiring board according to claim 1, wherein the at least one signal line includes a plurality of signal lines, and the at least one ground line includes a plurality of ground lines, and
wherein the plurality of ground lines include a first ground line connected to a connector used to electrically connect the first ground line to another component of the wiring board and a second ground line that is provided between the plurality of signal lines and that is not connected to the connector.

13. The wiring board according to claim 1, wherein the wiring board is a flexible printed board.

14. A method for manufacturing the wiring board according to claim 1, the method comprising:
forming the shield layer and the connection conductor line by screen printing.

15. An electronic module comprising:
the wiring board according to claim 1;
a rigid wiring board having an end portion of the wiring board connected to the rigid wiring board; and
an electronic component mounted on the rigid wiring board.

16. The electronic module according to claim 15, wherein the electronic component includes an image sensor.

17. An electronic unit comprising:

an electronic module having:

the wiring board according to claim 1, a rigid wiring board having an end portion of the wiring board connected to the rigid wiring board, and an electronic component mounted on the rigid wiring board; and a drive device configured to move the rigid wiring board.

18. An electronic device comprising:

an electronic module having:

the wiring board according to claim 1, a rigid wiring board having an end portion of the wiring board connected to the rigid wiring board, and an electronic component mounted on the rigid wiring board; and a circuit board having, connected to the circuit board, an end portion that is different from the at least one end portion of the wiring board, wherein a processor configured to process a signal output from the electronic component is mounted on the circuit board.

19. An electronic device comprising:

an electronic module having:

the wiring board according to claim 1, a rigid wiring board having an end portion of the wiring board connected to the rigid wiring board, and an electronic component mounted on the rigid wiring board; and an enclosure that accommodates the electronic module, wherein the wiring board is bent and accommodated in the enclosure, and wherein the shield layer is provided on an outer surface of two bent surfaces of the wiring board.

20. A wiring board comprising:

a wiring layer including a signal line and a ground line;

a shield layer that overlaps the wiring layer in plan view; and an insulating layer provided between the wiring layer and the shield layer, wherein the insulating layer includes a certain end portion that surrounds the insulating layer, wherein the certain end portion is located on at least the ground line, and wherein a connection conductor line configured to electrically connect the shield layer to the ground line is provided on part of the certain end portion.

* * * * *